US008497688B2

(12) United States Patent
Dorr et al.

(10) Patent No.: US 8,497,688 B2
(45) Date of Patent: Jul. 30, 2013

(54) NON-CONTACT ARC DETECTION APPARATUS AND METHOD

(75) Inventors: Douglas Stewart Dorr, Tavares, FL (US); Kermit O. Phipps, Harriman, TN (US); Thomas A. Cooke, Maynardville, TN (US); Francis S. Doherty, Yorktown Heights, NY (US); Neil Weisenfeld, Little Neck, NY (US)

(73) Assignee: Electric Power Research Institute, Inc., Charlotte, NC (US)

( * ) Notice: Subject to any disclaimer, the term of this patent is extended or adjusted under 35 U.S.C. 154(b) by 646 days.

(21) Appl. No.: 12/759,962

(22) Filed: Apr. 14, 2010

(65) Prior Publication Data
US 2011/0254534 A1    Oct. 20, 2011

(51) Int. Cl.
*H01H 9/50*    (2006.01)

(52) U.S. Cl.
USPC .......................................... 324/536; 324/520

(58) Field of Classification Search
USPC .................................................. 324/536, 520
See application file for complete search history.

(56) References Cited

U.S. PATENT DOCUMENTS

| 5,389,883 A * | 2/1995 | Harper ........................ 324/636 |
| 5,903,158 A * | 5/1999 | Eriksson et al. ............. 324/536 |
| 2003/0076093 A1* | 4/2003 | Lourens et al. .............. 324/247 |

* cited by examiner

*Primary Examiner* — Vincent Q Nguyen
(74) *Attorney, Agent, or Firm* — Trego, Hines & Ladenheim, PLLC

(57) ABSTRACT

The present invention relates to a non-contact arc detection, recognition, and warning apparatus for the detection of arcing in an electrical system. The apparatus includes an electric field detector having first and second electric field sensors adapted to sense electric fields; a magnetic field detector having a multi-axis magnetic field sensor adapted to detect a magnetic field; and a digital signal processor. The digital signal processor compares and enhances signals obtained from the electric field detector and the magnetic field detector and creates a response to alert a user of the presence of arcing.

16 Claims, 2 Drawing Sheets

NON-CONTACT ARC DETECTION APPARATUS AND METHOD

BACKGROUND OF THE INVENTION

The present invention relates generally to arc detection, and more particularly, to a non-contact arc detection apparatus and method.

The presence of arcing poses significant safety issues to individuals working in and around power distribution components. Historically, arc detection has been performed by level detection schemes from current sensing arc detectors in contact with the power line conductor, level detection by current sensors coupled to a power line conductor, rate-of-change of current or voltage from current transformers connected to the power line conductor, the change in phase relationship of the current on the power line conductor compared to an externally generated signal, and the comparison of the phase plane plot change of the current and voltage on the power line conductor. Each of the above methods and apparatuses have required direct contact, coupled sensing, or direct connection to the monitored power line. Further, methods and prior art have been direct or coupled to only single power lines.

In the case of underground vaults, workers often encounter more than a single power line, resulting in the need to monitor each line. In addition to the need to know of potential electrical safety hazards prior to entering the vaults, workers need to be able to monitor potential arcing problems while working with distribution cables and components in these vaults to alert them when arcing conditions occur.

Limitations of the above prior art methods include problems associated with unknown vault conditions prior to vault egress and the condition of installed equipment in vaults where vault flooding may compromise electronic equipment and lack of early warning devices and methods during the time work is performed in the vault. Further limitations of the number of cables in the vault requiring monitoring are apparent.

BRIEF SUMMARY OF THE INVENTION

These and other shortcomings of the prior art are addressed by the present invention, which provides an apparatus and method to perform non-contact arc detection, recognition, and warning on electrical power lines.

According to one aspect of the present invention, a non-contact arc detecting apparatus includes an electric field detector having first and second electric field sensors adapted to sense electric fields; a magnetic field detector having a multi-axis magnetic field sensor adapted to detect a magnetic field; and a digital signal processor adapted to compare and enhance signals obtained from the electric and magnetic field detectors and create a response to alert a user of the presence of arcing.

According to another aspect of the present invention, a portable non-contact arc detection, recognition, and warning apparatus includes an electric field detector, a magnetic field detector, and a digital signal processor. The electric field detector includes first and second electric field sensors adapted to sense electric fields; first and second AM receiver circuits electrically connected to the first and second electric field sensors to transform signals received from the first and second electric field sensors into LO-band and HI-band signals; and first and second demodulators electrically connected to the first and second AM receiver circuits to receive the LO-band and HI-band signals and resolve audio frequencies of the LO-band and HI-band signals in the 1 Hz to about 20 KHz range to form DEMOD-LO and DEMOD-HI signals. The magnetic field detector includes a multi-axis magnetic field sensor adapted to detect a magnetic field; a first HI-pass filter electrically connected to the multi-axis magnetic field sensor to form a first buffered HI-pass signal; a second HI-pass filter electronically connected to the multi-axis magnetic field sensor; and a series of three $12^{th}$ order notch filters electrically connected to the second HI-pass filter to form a second buffered HI-pass signal. The digital signal processor is adapted to receive the DEMOD-LO, DEMOD-HI, first buffered HI-pass, and second buffered HI-pass signals from the electric field and magnetic field detectors to compare and enhance the signals and create a response to alert a user of the presence of arcing.

According to another aspect of the present invention, a method of determining an arcing condition includes the steps of providing an arc detection device having an electric field detector, a magnetic field detector, and a digital signal processor. The method further includes the steps of simultaneously detecting waveform signatures in both electric and magnetic fields using the electric and magnetic field detectors; enhancing the signatures using signal processing techniques; using the digital signal processor to form time coordinated signals of the enhanced signatures; using the digital signal processor to compare the time coordinated signals to a third derivative signal of the magnetic field to determine arcing conditions; and reporting arcing conditions to a user.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 1:
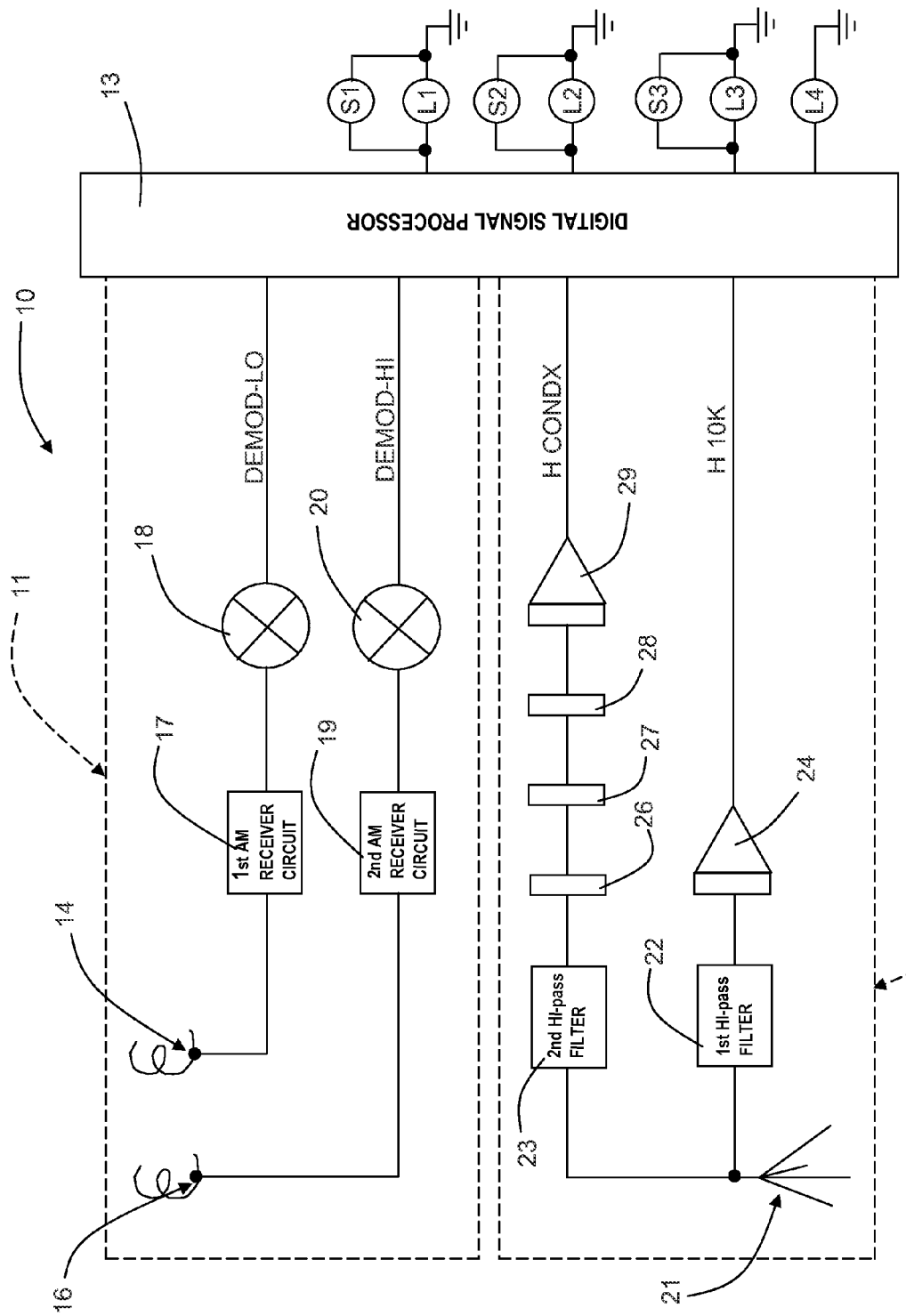
FIG. 1 is a schematic drawing of a non-contact arc detection and warning apparatus according to an embodiment of the invention.

Referring to the drawings, an exemplary non-contact arc detection, recognition, and warning apparatus according to the present invention is illustrated in FIG. 1 and shown generally at reference numeral 10.

The apparatus 10 performs non-contact arc detection, recognition, and warning of arcing on electrical power lines by simultaneously evaluating time coordinated characteristic waveform signatures in both the Electric (E) and Magnetic (H) fields and further comparing those time coordinated electric and magnetic field signatures with a time coordinated third derivative signal of the Magnetic field (H).

The apparatus 10 includes an electric field (E) detector 11, a magnetic field (H) detector 12, and a digital signal processor 13. The electric field detector 11 includes first and second electric field sensors 14 and 16, respectively, for sensing electric fields (E). The first and second electric field sensors 14 and 16 may be of helical construction having a resonant frequency of 300 MHz. Other suitable constructions may be used. The first electric field sensor 14 is electrically connected to a first AM receiver circuit 17 which receives a signal from the first electric field sensor 14. The first AM receiver circuit 17 operates in a 100 kHz to 300 kHz LO-band and transforms the signal into a LO-band signal. A first demodulator 18 is electrically connected between the first AM receiver circuit 17 and the digital signal processor 13. The first demodulator 18 demodulates the LO-band signal into a DEMOD-LO signal to resolve audio frequencies in the 1 Hz to 20 KHz range and sends it to the digital signal processor 13 to be processed and compare even harmonics and inter-harmonics of a 60 Hz fundamental frequency to a pre-determined threshold.

The second electric field sensor 16 is electrically connected to a second AM receiver circuit 19 which receives a signal from the second electric field sensor 16 and transforms the signal into a HI-band signal. The second AM receiver circuit 19 operates in a 1 MHz to 5 MHz HI-band. A second demodulator 20 is electrically connected between the second AM receiver circuit 19 and the digital signal processor 13. The second demodulator 20 demodulates the HI-band signal into a DEMOD-HI signal to resolve audio frequencies in the 1 Hz to 20 KHz range and sends it to the digital signal processor 13 to be processed and compare even harmonics and inter-harmonics of a 60 Hz fundamental frequency to a pre-determined threshold.

The magnetic field (H) detector 12 includes a multi-axis magnetic field sensor 21 electrically connected to first and second HI-pass filters 22 and 23. The magnetic sensor 21 includes five coils wound on five ferrite rods in series connection and physically placed in a 45 degree orientation. It should be appreciated that other appropriate orientations or combinations may be used.

The first HI-pass filter 22 is a 10 KHz HI-pass filter. The first HI-pass filter 22 is electrically connected to a gain amplifier 24 and forms a buffered HI-pass signal (H 10K). The HI-pass signal is amplified by the amplifier 24 and sent to the digital signal processor 13.

The second HI-pass filter 23 is a 200 Hz HI-pass filter. The second HI-pass filter 24 is electrically connected to a series of three $12^{th}$ order, notch filters 26, 27, 28 and a gain amplifier 29. Notch filter 26 is a 300 Hz notch filter connected in series to the 200 Hz Hi-pass filter output. Notch filter 27 is a 420 Hz notch filter connected in series to the 300 Hz notch filter 26 output. Notch filter 28 is a 540 Hz notch filter connected in series to the 420 Hz notch filter 27 output. The gain amplifier 29 is electrically connected to the output of the 540 Hz notch filter 28. A buffered HI-pass signal (H CONDX) is formed by the filters 23, 26, 27, 28, and gain amplifier 29, and is sent to the digital signal processor 13.

Figure 2:
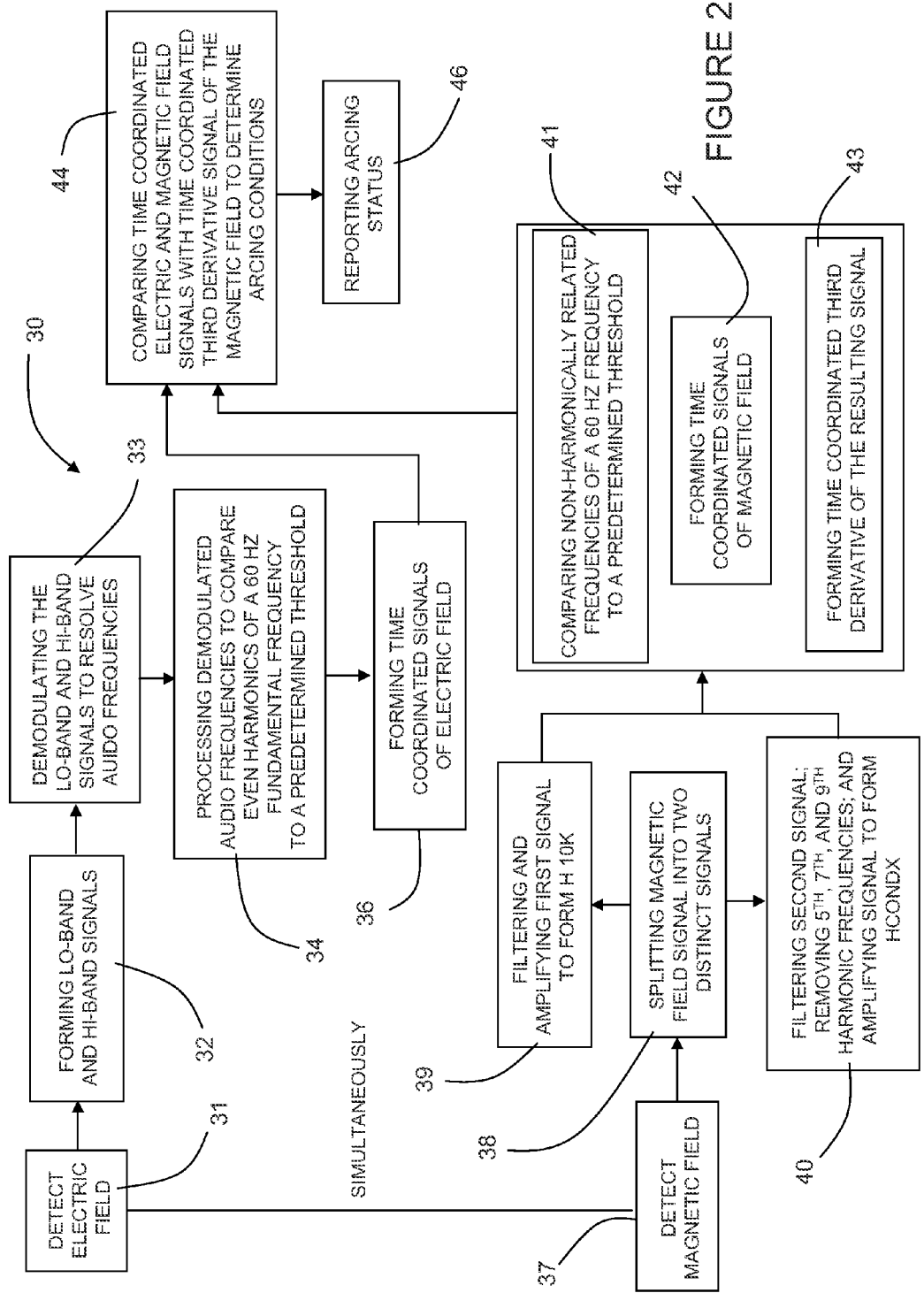
FIG. 2 is a block diagram of a method according to an embodiment of the invention.

Referring to FIG. 2, a method according to an embodiment of the invention is shown generally at reference numeral 30. It should be appreciated that the present invention may apply to single power line conductors, multiple power line conductors, arcing to grounded objects, or arcing to other proximate power line conductors.

In general, the method includes the steps of (1) sensing the electric field (E) and magnetic field (H); (2) forming two signals from the sensed electric field into two bands (LO-band and HI-band); (3) demodulating the two LO-band and HI-band signals; (4) presenting the two demodulated signals DEMOD-LO and DEMOD-HI to the digital signal processor 13; (5) sensing the magnetic field using a multi-axis magnetic field sensor 21; (6) forming an additional two signals H 10K and H CONDX from the sensed magnetic field sensor 21; (7) presenting the two signal conditioned signals H 10K and H CONDX to the digital signal processor 13; (8) using the digital signal processor 13 to compare and analyze frequency components from signals DEMOD-LO and DEMOD-HI; (9) comparing the magnitude of the third derivative of signal H CONDX to a preset level; (10) comparing the magnitude of the signal H 10K to a preset level; (11) determining a result as to arcing, voltage, or other conditions from the time coordinated four signals; and (12) enunciating the result via tone alerts and indicator status lights.

More particularly, the method includes sensing electric fields (E) from two distinct electric field sensors 14 and 16, Block 31. Electric field signals representative of the sensed electric fields from the sensors 14 and 16 are received by AM receiver circuits 17 and 19, respectively, Block 32. The output of each of these receivers 17, 19 (signal LO-band and signal HI-band) is separately demodulated (signal DEMOD-LO and signal DEMOD-HI) by a respective one of demodulators 18 and 20 and provides an audio range signal for further processing by digital signal processor 13, Block 33. These two signals, DEMOD-LO and DEMOD-HI, are independently connected to analog inputs of the digital signal processor 13. The digital signal processor 13 processes the demodulated frequencies to compare even harmonics and inter-harmonics of 60 Hz, Block 34, and forms time coordinated signals of the signals, Block 36,—DEMOD-LO and DEMOD-HI using digital signal processing and analog techniques.

The method further includes the steps of simultaneously sensing magnetic fields (H) from multi-axis magnetic field sensor 21, Block 37, buffering the signal representing the sensed magnetic fields (H), and forming two distinct signals, Blocks 38-40. The first signal (H 10K) is enhanced from the output of a Hi-pass filter stage (HI-pass filter 22 and gain amplifier 24) series connected to the magnetic field sensor 21, Block 39. The second signal (H CONDX) is enhanced from the output of a signal conditioning stage (filters 23, 26, 27, 28 and amplifier 29) series connected to the magnetic field sensor 21, Block 40. The first and second signals (H 10K and H CONDX) are independently connected to analog inputs of the digital signal processor 13. The digital signal processor 13 compares the non-harmonically related frequencies of a 60 Hz fundamental frequency to a pre-determined threshold, Block 41, and forms time coordinated signals of the signals, Block 42.

It should be appreciated that the high order filter designs and the use of specific notch frequencies are determined as harmonics of a 60 Hz fundamental frequency. It should also be appreciated that the signal conditioning stage may be implemented as a series of analog filters or a digitally processed signal in a digital signal processor. The choice of notch frequencies represents the $5^{th}$, $7^{th}$, and $9^{th}$, harmonic of the 60 Hz fundamental in the preferred embodiment. It should be appreciated that other fundamental frequencies and harmonic frequencies may be chosen for the signal conditioning stage.

The method also includes the steps of using the digital signal processor 13 to (a) evaluate the components of even harmonics found in signals DEMOD-LO and DEMOD-HI, Block 34, (b) compare the second harmonic magnitude found in signal DEMOD-LO to a reference signal, Block 34, (c) compare the second harmonic magnitude found in signal DEMOD-HI to a reference signal, Block 34, (d) form a third derivative of the signal H CONDX, Block 43, (e) compare the status of time coordinated electric (E) and magnetic (H) field signals with the time coordinated third derivative signal of the magnetic field (H) to determine if an arc is present, Block 44, and (f) send a signal to report via distinct tones and indicators the status of arcing conditions thus determined, Block 46.

It should be appreciated that the magnetic and electric field sensors may be combined into a single package sensor such that it may be safely lowered into an underground vault to determine the safety conditions in the vault prior to workers entering the vault. It should be appreciated that the apparatus 10 may be a hand held apparatus to allow use of the apparatus 10 in tight confines and to allow easy transport. Further, once in the vault, the apparatus will continue to monitor arcing conditions to alert workers to arcing conditions.

It should be appreciated that the digital signal processing of signals may be accomplished using analog circuit elements in other embodiments of the invention.

The foregoing has described a non-contact arc detecting apparatus and method. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

We claim:

1. A non-contact arc detecting apparatus, comprising:
  (a) an electric field detector having first and second electric field sensors adapted to sense electric fields;
  (b) a magnetic field detector having a multi-axis magnetic field sensor adapted to detect a magnetic field, the magnetic field sensor being electrically connected to first and second HI-pass filters to form first and second HI-pass signals, wherein a series of $12^{th}$ order notch filters are electrically connected to the second HI-pass filter to form the second HI-pass signal;
  (c) a digital signal processor adapted to compare and enhance signals obtained from the electric field detector and the magnetic field detector and create a response to alert a user of the presence of arcing.

2. The apparatus according to claim 1, wherein the digital signal processor simultaneously evaluates time coordinated characteristic waveform signatures detected by both the electric field detector and the magnetic field detector and compares the time signatures with a time coordinated third derivative signal of the detected magnetic field.

3. The apparatus according to claim 1, further including:
  (a) a first AM receiver circuit electrically connected to the first electric field sensor, the first AM receiver circuit adapted to transform an electric field signal from the first electric field sensor into a LO-band signal;
  (b) a first demodulator electrically connected between the first AM receiver circuit and the digital signal processor, the first demodulator being adapted to demodulate the LO-band signal into a DEMOD-LO signal to resolve audio frequencies prior to being sent to the digital signal processor;
  (c) a second AM receiver circuit electronically connected to the second electric field sensor, the second AM receiver circuit adapted to transform an electric field signal from the second electric field sensor into a HI-band signal; and
  (d) a second demodulator electrically connected between the second AM receiver circuit and the digital signal processor, the second demodulator being adapted to demodulate the HI-band signal into a DEMOD-HI signal to resolve audio frequencies prior to being sent to the digital signal processor.

4. The apparatus according to claim 3, wherein the first AM receiver circuit operates in a 100 kHz to 300 kHz LO-band frequency range and the second AM receiver circuit operates in a 1 MHz to 5 MHz HI-band frequency range.

5. The apparatus according to claim 3, wherein the first and second demodulators resolve audio frequencies in the 1 Hz to 20 KHz range.

6. The apparatus according to claim 3, wherein the DEMOD-LO and DEMOD-HI signals are processed by the digital signal processor to compare even harmonics of a 60 Hz fundamental frequency to a pre-determined threshold level.

7. The apparatus according to claim 1, further including:
  (a) a first gain amplifier electrically connected between the first HI-pass filter and the digital signal processor adapted to amplify the first HI-pass signal; and
  (b) a second gain amplifier electrically connected between the second HI-pass filter and the digital signal processor to form an amplified, buffered second HI-pass signal.

8. The apparatus according to claim 1, wherein the series of $12^{th}$ order notch filters include:
  (a) a 300 Hz notch filter connected in series to the second HI-pass filter;
  (b) a 420 Hz notch filter connected in series to the 300 Hz notch filter; and
  (c) a 540 Hz notch filter connected in series between the 420 Hz notch filter and the second gain amplifier.

9. The apparatus according to claim 1, wherein the apparatus is a single packaged, portable device.

10. The apparatus according to claim 1, wherein the first and second electric field sensors are of a helical construction with each of the sensors having a resonant frequency of about 300 MHz.

11. A portable non-contact arc detection, recognition, and warning apparatus, comprising:
  (a) an electric field detector having:
    (i) first and second electric field sensors adapted to sense electric fields;
    (ii) first and second AM receiver circuits electrically connected to the first and second electric field sensors to transform signals received from the first and second electric field sensors into LO-band and HI-band signals;
    (iii) first and second demodulators electrically connected to the first and second AM receiver circuits to receive the LO-band and HI-band signals and resolve audio frequencies of the LO-band and HI-band signals in the 1 Hz to about 20 KHz range to form DEMOD-LO and DEMOD-HI signals;
  (b) a magnetic field detector having:
    (i) a multi-axis magnetic field sensor adapted to detect a magnetic field;
    (ii) a first HI-pass filter electrically connected to the multi-axis magnetic field sensor to form a first buffered HI-pass signal;
    (iii) a second HI-pass filter electronically connected to the multi-axis magnetic field sensor;
    (iv) a series of $12^{th}$ order notch filters electrically connected to the second HI-pass filter to form a second buffered HI-pass signal;
  (c) a digital signal processor adapted to receive the DEMOD-LO, DEMOD-HI, first buffered HI-pass, and second buffered HI-pass signals from the electric field and magnetic field detectors to compare and enhance the signals and create a response to alert a user of the presence of arcing.

12. A method of determining an arcing condition, comprising the steps of:
  (a) providing an arc detection device having:
    (i) an electric field detector;
    (ii) a magnetic field detector;
    (iii) a digital signal processor;
  (b) simultaneously detecting waveform signatures in both electric and magnetic fields using the electric and magnetic field detectors;

(c) forming LO-band and HI-band signals from the electric field signatures and demodulating the LO-band and HI-band signals to form a DEMOD-LO signal and a DEMOD-HI signal;

(d) forming first and second HI-pass signals from the magnetic field signatures;

(e) using the digital signal processor to process the DEMOD-LO and DEMOD-HI signals and form;

(f) using the digital signal processor to process the first and second HI-pass signals and form time coordinated magnetic field signals and a third derivative signal of the magnetic field;

(g) using the digital signal processor to compare the time coordinated electric and magnetic field signals to the third derivative signal of the magnetic field to determine arcing conditions; and (h) reporting arcing conditions to a user.

13. The method according to claim 12, further including the steps of:

(a) receiving the electric field signatures in a 100 kHz to 300 kHz LO-band AM receiver to create the LO-band signal;

(b) receiving the LO-band signal in a first demodulator to resolve audio frequencies in a 1 Hz to about 20 KHz range and form a the DEMOD-LO signal; and (c) processing the DEMOD-LO signal using the digital signal processor to compare even harmonics of a 60 Hz fundamental frequency to a predetermined threshold value.

14. The method according to claim 12, further including the steps of:

(a) receiving the electric field signatures in a 1 MHz to 5 MHz HI-band AM receiver to create the HI-band signal;

(b) receiving the HI-band signal in a second demodulator to resolve audio frequencies in a 1 Hz to about 20 KHz range and form the DEMOD-HI signal; and (c) processing the DEMOD-HI signal using the digital signal processor to compare even harmonics of a 60 Hz fundamental frequency to a predetermined threshold value.

15. The method according to claim 12, further including the steps of:

(a) receiving the magnetic field signature in a HI-pass filter to form the first HI-pass signal;

(b) amplifying the first HI-pass signal; and (c) processing the amplified first HI-pass signal in the digital signal processor to compare non-harmonically related frequencies of a 60 Hz fundamental frequency to a pre-determined threshold.

16. The method according to claim 12, further including the steps of:

(a) receiving the magnetic field signature in a HI-pass filter to remove frequencies below 200 Hz and form a the second HI-pass signal;

(b) removing $5^{th}$ harmonic frequencies from the second HI-pass signal using a $12^{th}$ order notch filter;

(c) removing $7^{th}$ harmonic frequencies from the second HI-pass signal using a $12^{th}$ order notch filter;

(d) removing $9^{th}$ harmonic frequencies from the second HI-pass signal using a $12^{th}$ order notch filter;

(e) amplifying the second HI-pass signal;

(f) using the digital signal processor to form the third derivative signal of the second HI-pass signal; and (g) comparing a magnitude of the third derivative signal to a pre-determined threshold level.

\* \* \* \* \*

UNITED STATES PATENT AND TRADEMARK OFFICE
CERTIFICATE OF CORRECTION

PATENT NO. : 8,497,688 B2
APPLICATION NO. : 12/759962
DATED : July 30, 2013
INVENTOR(S) : Dorr et al.

It is certified that error appears in the above-identified patent and that said Letters Patent is hereby corrected as shown below:

In the Claims

Column 7, line 8, after "form" insert -- time coordinated electric field signals --.
Column 7, line 25, delete "a".
Column 8, line 20, delete "a".

Signed and Sealed this
Seventeenth Day of September, 2013

Teresa Stanek Rea
*Deputy Director of theUnited States Patent and Trademark Office*